United States Patent [19]
Patel

[11] Patent Number: 5,349,255
[45] Date of Patent: Sep. 20, 1994

[54] PROGRAMMABLE Tco CIRCUIT

[75] Inventor: Rakesh H. Patel, Santa Clara, Calif.

[73] Assignee: Altera Corporation, San Jose, Calif.

[21] Appl. No.: 28,092

[22] Filed: Mar. 8, 1993

[51] Int. Cl.5 .............................................. H03K 5/135
[52] U.S. Cl. ................................... 307/593; 307/243; 307/247.1; 307/272.2; 328/72
[58] Field of Search ............ 307/243, 269, 271, 272.1, 307/272.2, 272.3, 593, 597, 601, 603; 328/55, 63, 72, 74

[56] References Cited

U.S. PATENT DOCUMENTS

| | | | |
|---|---|---|---|
| 3,812,384 | 5/1974 | Skorup | 307/272.2 |
| 4,797,575 | 1/1989 | Lofgren | 307/272.1 |
| 5,136,180 | 8/1992 | Caviasca et al. | 307/269 |
| 5,159,278 | 10/1992 | Mattison | 307/269 |

Primary Examiner—Timothy P. Callahan
Assistant Examiner—Shawn Riley
Attorney, Agent, or Firm—Townsend and Townsend Khourie and Crew

[57] ABSTRACT

A circuit having a data path with a programmable clock-to-output delay time ($t_{co}$). The circuit includes a master-slave flip-flop and selection/predriver logic circuitry whereby two select inputs can program the circuit into one of three different modes of operation. In a data-in mode, the input data is directly connected to the output driver, bypassing the flip-flop. In a fast mode, the circuit $t_{co}$ is reduced such that a higher frequency clock may be used. For low noise operation, the fast mode may be turned off to put the circuit in the regular mode, allowing the circuit to run at lower clock frequencies.

4 Claims, 2 Drawing Sheets

PROGRAMMABLE $T_{co}$ CIRCUIT

BACKGROUND OF THE INVENTION

The present invention relates in general to digital circuits using clocked flip-flops, and in particular to a circuit that provides a programmable clock-to-output delay time ($t_{co}$).

Flip-flops are often used to synchronize incoming data to a particular clock signal. A master-slave flip-flop is a level-triggered circuit that consists of two latches. A first latch (master) accepts the input data on one clock transition and transfers this data to a second latch (slave) on the alternate clock transition.

Clock-to-output delay time ($t_{co}$) is a parameter used to measure the time it takes data to propagate through a flip-flop after a clock transition. Typically, $t_{co}$ includes three delay components: the delay from the clock input pin to the flip-flop, the delay associated with the transfer of data from the master to the slave stage, and the delay due to transfer of data from the slave stage to the output pin. Depending on the clock frequency, very fast flip-flops can be designed with delays in the range of a few nanoseconds. However, at higher clock frequencies the noise generated by transistor switching increases. The amount of noise substantially increases, for example, in circuits where a large number of flip-flops are clocked simultaneously at these higher frequencies. To decrease noise, it is therefore sometimes desirable to have the option of running the circuit at lower clock frequencies. However, once, for example, a master-slave flip-flop is designed to operate at a typical frequency, the range of frequencies in which it can operate is limited.

It is therefore, desirable to design flip-flops that can be programmed to operate at appreciably higher frequencies than their normal operating frequency.

SUMMARY OF THE INVENTION

The present invention provides a flip-flop circuit with a clock-to-output delay time $t_{co}$ that is programmable for faster operation. The present invention takes advantage of the two-stage structure of a master-slave flip-flop to provide a "Fast $t_{co}$" option with minimum additional circuitry.

In a preferred embodiment, the circuit of the present invention includes a two-stage flip-flop for data synchronization. The first stage of the flip-flop latches in the input data during a low state of a clock signal. The output of this first stage is transferred to the second stage upon the clock turning high. At the same time, after being clocked by the first stage, the input data feeds forward to an output as a "fast" output of the flip-flop. The output of the second stage forms the regular ("sustain") output of the flip-flop. These two outputs feed into a selection/predriver circuit such that when the flip-flop "fast" output is selected, the data is already present at the selection/predriver input for the rising edge of the clock to output the data. Therefore, the propagation time associated with the second stage is eliminated, reducing the overall circuit $t_{co}$. The selection/predriver circuit connects the circuit output to the flip-flop "fast" output during the high cycle of the clock, while during the low cycle of the clock, the circuit output is sustained by the flip-flop "sustain" output. Select bits operate several switches to remove the "fast" output option from the circuit to obtain a flip-flop with a slower $t_{co}$.

A further understanding of the present invention may be had with reference to the description and diagrams below.

DESCRIPTION OF THE PREFERRED EMBODIMENT

Figure 1:
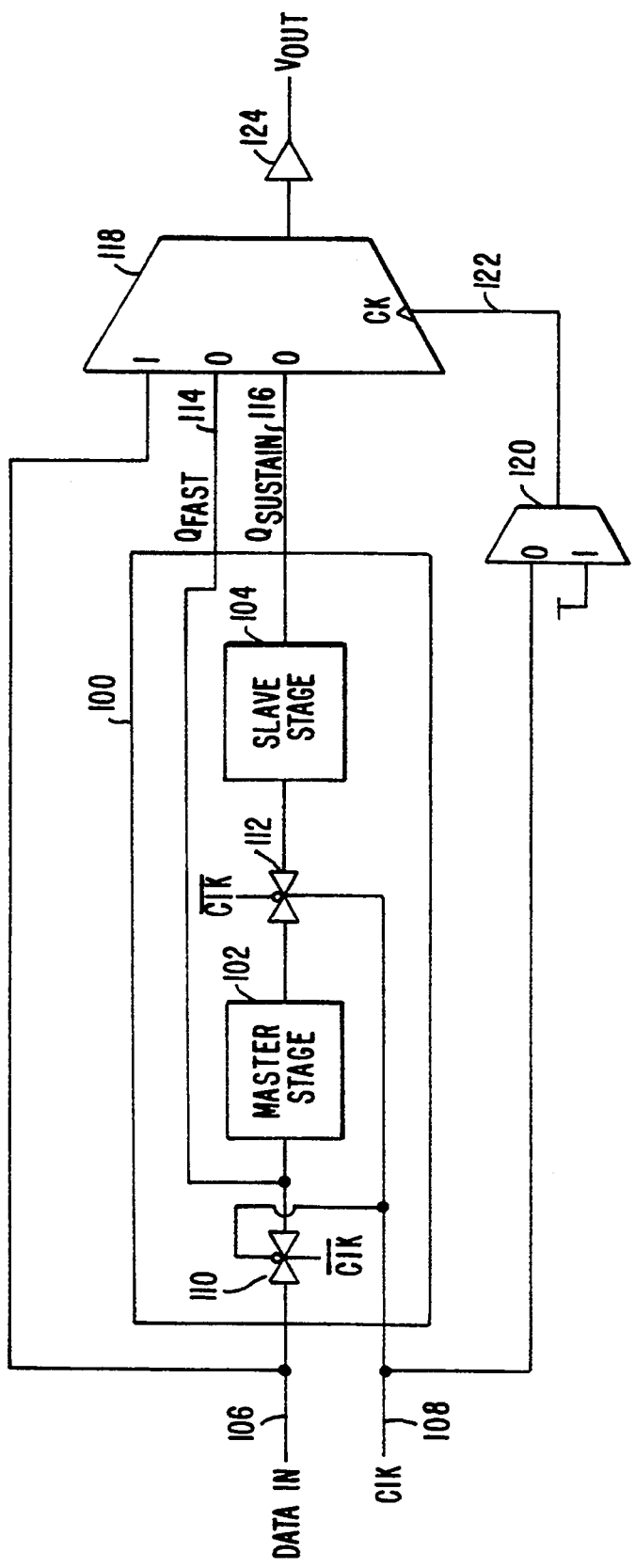
FIG. 1 is a block diagram of the programmable $t_{co}$ circuit of the present invention.

FIG. 1 is a block diagram of the programmable $t_{co}$ circuit of the present invention. The circuit includes a two-stage flip-flop 100 with a master stage 102 and a slave stage 104. The master stage 102 and the slave stage 104 each comprise conventional latch circuits. Input data connects to flip-flop 100 at data-in line 106, while the clock signal connects to flip-flop 100 at clock terminal clk 108. Input data goes through a transmission gate 110 which passes data through to master stage 102 when the clock is low. Another transmission gate 112 connects master stage 102 to slave stage 104. Transmission gate 112 passes data through when the clock is high. Flip-flop 100 has two outputs, a fast output Qfast 114 at the output side of transmission gate 110, and a sustain output $Q_{sustain}$ 116 at the output of slave stage 104. Each of these outputs connects to an input of a selection/predriver logic 118. Data-in line 106 also connects to selection/predriver logic 118. Clk 108 connects to one input of a two-input multiplexer (MUX) 120. The other input of MUX 120 connects to a constant logical high (the power supply), while its output drives a clock input terminal 122 of selection/predriver logic 118. An output driver 124 connects the output of selection/predriver logic 118 to the output of the circuit Vout.

Master-slave flip-flop 100 is a level-triggered circuit that consists of two latches. A first latch (master stage 102) accepts the input data on one clock transition and transfers this data to a second latch (slave stage 104) on the alternate clock transition. Flip-flop 100 is designed such that master stage 102 accepts input data from data-in line 106 during a low state of the clock signal on clk 108. Therefore, input data is available at $Q_{fast}$ 110 within a few nanoseconds after the clock turns low. No change occurs in the state of slave stage 104 while the clock is low. During this period, slave stage 104 sustains the previous state $Q_{sustain}$. After the clock turns high, master stage 102 locks in the input data it had accepted and transfers it to slave stage 104. Within a few nanoseconds thereafter, the input data appears at $Q_{sustain}$ 112. At this point, both outputs $Q_{fast}$ 110 and $Q_{sustain}$ 112 reflect the same input data.

Therefore, $Q_{fast}$ 110 forecasts the regular output of flip-flop 100 (i.e. $Q_{sustain}$ 112) by approximately one half of the clock cycle. So when the clock turns high, the input data is already available at one input of selection/predriver logic 118. If the "fast" option is selected, a rising edge of the clock connects $Q_{fast}$ to the output of selection/predriver 118. In that case, the circuit $t_{co}$ is reduced by several nanoseconds since selection/predriver logic 118 need not wait for the input data to propagate through slave stage 104. The faster $t_{co}$ allows the circuit to run at higher clock frequencies if so desired.

If the "fast" option is not selected, the regular flip-flop output $Q_{sustain}$ connects to the output of selection/predriver logic 118. When the rising edge of the clock arrives, the input data is clocked into slave stage 104 and has to propagate through slave stage 104 before it appears at the input of selection/predriver logic 118. In this mode, because of the longer $t_{co}$, the circuit runs at a lower clock frequency. This allows for the design of a flip-flop with two operating frequencies.

Figure 2:
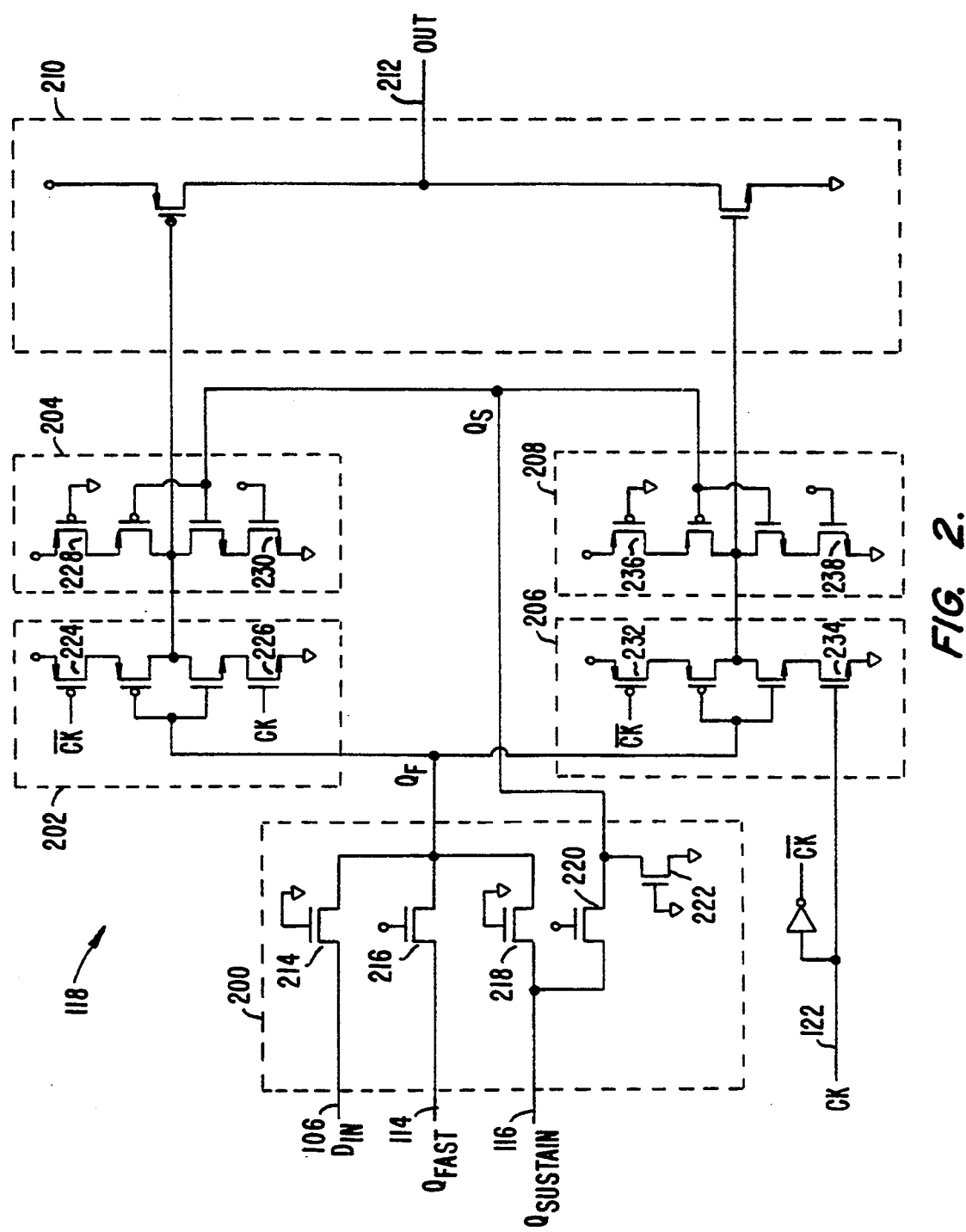
FIG. 2 is a circuit diagram of a selection/predriver logic block of the present invention.

FIG. 2 is an illustrative example of a circuit implementing selection/predriver logic 118. It includes a selection circuit 200, four predriver stages 202, 204, 206 and 208, and an output driver 210. Each predriver circuit is in the form of a gated inverter with a pair of NMOS and PMOS driver transistors and a pair of NMOS and PMOS enable transistors. When turned on, the enable transistors connect the driver transistors to ground and the power supply. The four predrivers are designed such that, when all four are driving, the outputs of predrivers 202 and 206 override the outputs of predrivers 204 and 208, respectively. This is achieved by appropriate sizing of the transistors.

The selection/predriver 118 provides for three different modes of operation. A first mode allows the user to bypass flip-flop 100 (see FIG. 1) and transfer the input data directly to the output by connecting Data-in line 106 to the inputs of predrivers 202 and 206. At the same time, MUX 120 connects the clock input terminal ck 122 of selection/predriver 118 to a logical high to enable predrivers 202 and 206. Predrivers 204 and 208 are disabled by turning off their enable transistors. With this circuit configuration, input data appears at $Q_f$ and predrivers 202 and 206 apply the input data to the inputs of output driver 210. Output driver 210 drives the input data out to circuit output 212.

Fast mode is a second mode of operation and connects $Q_{fast}$ to the $Q_f$ inputs of predrivers 202 and 206, and $Q_{sustain}$ to the $Q_s$ inputs of predrivers 204 and 208. FIG. 2 shows the selection/predriver 118 circuit configured in the fast mode. Predrivers 204 and 208 are enabled and MUX 120 connects ck 122 to the input clock signal (at clk 108 in FIG. 1). In this mode, predrivers 204 and 208 drive $Q_{sustain}$ to output 212, while predrivers 202 and 206 are enabled only when clock signal (at clk 108) is high. Because predrivers 202 and 206 are stronger than predrivers 204 and 208, when the clock turns high, $Q_{fast}$ overrides $Q_{sustain}$ and is driven to output 212. As soon as the clock turns low predrivers 202 and 206 are disabled and predrivers 204 and 208 drive $Q_{sustain}$ to output 212. Therefore, when a rising edge of the clock signal on clk 108 arrives, the input data that has already been clocked in (during the preceding low cycle of the clock) by master stage 102 of flip-flop 100 (FIG. 1) outputs at output 212. The driver need not wait for slave stage 104 to propagate the same input data through to the output of flip-flop 100. On the falling edge of the clock, predrivers 204 and 208 sustain the data at output 212.

The regular mode of operation connects $Q_{sustain}$ 116 of flip-flop 100 to the $Q_f$ inputs of the stronger predrivers 202 and 206, and disables the other two predrivers (204 and 208). The circuit now operates as a conventional master-slave flip-flop that clocks input data out to an output driver. Therefore, input data at data-in 106 is latched in by master stage 102 during a low state of the clock, and transferred to slave stage 104 when the clock turns high. Input data then appears at $Q_{sustain}$ 116 of flip-flop 100 with a delay equal to slave stage 104 propagation delay time, after the rising edge of the clock. Table 1 shows the state of transistors in the selection circuit 200 in each mode of operation:

TABLE 1

| Mode of Operation | Transistors ON | Transistors OFF |
| --- | --- | --- |
| Bypass | 214, 222 | 216, 218, 220 |
| Fast | 216, 220 | 214, 218, 222 |
| Regular | 218, 222 | 214, 216, 220 |

Table 2 shows the state of transistors in the predrivers 202, 204, 206 and 208 in each mode of operation:

TABLE 2

| Mode | Transistors ON | Transistors OFF |
| --- | --- | --- |
| Bypass | Clocked Transistors | 228, 230, 236, 238 |
| Fast | All | NONE |
| Regular | Clocked Transistors | 228, 230, 236, 238 |

The $t_{co}$ of the present circuit is, therefore, adjustable to run at higher frequencies by eliminating the propagation delay time of the slave stage of a master-slave flip-flop.

In conclusion, the present invention offers a circuit with a programmable $t_{co}$. In a fast mode, the circuit $t_{co}$ is reduced such that a higher frequency clock may be used. For low noise operation, the fast mode is turned off to allow the circuit to run at lower clock frequencies. While the above is a complete description of the preferred embodiment of the present invention, it is possible to use various alternatives, modifications and equivalents. For example, for applications where a direct connection between input line data-in 106 and selection/predriver 118 is not required, this option may be removed. Also, the relative strength of the predriver stages may vary in different applications requiring different output drive capability. The clock convention may also be reversed to measure $t_{co}$ from the falling edge of the clock to the output, rather than the rising edge. Therefore, the scope of the present invention should be determined not with reference to the above description but should, instead, be determined with reference to the appended claims, along with their full scope of equivalents.

What is claimed is:

1. A circuit having a data path with a programmable clock-to-output delay time ($t_{co}$), the circuit comprising:
    a flip-flop circuit having a first and a second stage, with a data input, a clock input, a first output from the first stage, and a second output at an output of the second stage, the flip-flop comprising:
    a first clocked gate having an input coupled to the data input, and an output coupled to the flip-flop first output, the first clocked gate coupling the data input to the flip-flop first output upon a first state of the clock signal;
    a first latch with an input coupled to the first clocked gate output, and an output;
    a second clocked gate having an input coupled to the first latch output, and an output, the second clocked gate coupling the first latch output to the second clocked gate output upon a second state of the clock signal; and
    a second latch with an input coupled to the second clocked gate output, and an output coupled to the flip-flop second output; and
    selection/predriver logic having a first input coupled to the flip-flop first output, a second input coupled to the flip-flop second output, a plurality of select inputs and an output, wherein the selection/predriver logic receives a plurality of select signals at the plurality of select inputs for selecting a fast mode and connecting the flip-flop first output to the selection/predriver logic output during a first state of a clock signal at the clock input.

2. The circuit of claim 1 wherein the selection/predriver logic further comprises:
- a selection logic circuit with a first input coupled to the flip-flop first output, a second input coupled to the flip-flop second output, at least one select input, a fast output and a sustain output;
- a first set of predrivers with an input coupled to the selection logic circuit fast output, an enable input coupled to the clock input, and a first and a second output;
- a second set of predrivers with an input coupled to the selection logic circuit sustain output, an enable input, and a first and a second output coupled to the first set of predrivers first and second outputs, respectively; and
- an output driver with a first input coupled to the first and second predriver first output, a second input coupled to the first and second predriver second output, and an output,
- the flip-flop first stage output coupling to the output driver output during a first state of a clock signal at the clock input, and the flip-flop second stage output coupling to the output driver output during a second state of the clock signal, in the fast mode.

3. A circuit having a data path with a programmable clock-to-output delay time ($t_{co}$), the circuit comprising:
- a flip-flop circuit having a first and a second stage, with a data input, a clock input, a first output from the first stage, and a second output at an output of the second stage; and
- selection/predriver logic having a first input coupled to the flip-flop first output, a second input coupled to the flip-flop second output, a plurality of select inputs and an output, the selection/predriver further comprising:
  - a selection logic circuit with a first input coupled tot eh flip-flop first output, a second input coupled to the flip-flop second output, at least one select input, a fast output and a sustain output;
  - a first set of predrivers with an input coupled to the selection logic circuit fast output, an enable input coupled to the clock input, and a first and a second output;
  - a second set of predrivers with an input coupled to the selection logic circuit sustain output, an enable input, and a first and a second output coupled to the first set of predrivers first and second outputs, respectively; and
  - an output driver with a first input coupled to the first and second predriver first output, a second input coupled to the first and second predriver second output, and an output,
  - wherein, the flip-flop first stage output coupling tot eh output driver output during a first state of a clock signal at the clock input, and the flip-flop second stage output coupling to the output driver output during a second state of the clock signal, in the fast mode.

4. A method for adjusting a clock-to-output delay time of a two-stage flip-flop having a data input at an input terminal of a first stage and a first output terminal and a second output terminal at an output of a second stage, with each stage having a clocked gate followed by a latch, the method comprising the steps of:
(a) coupling an input data through a clocked gate of the first stage, from the data input terminal to an input of a latch of the first stage and the first output terminal, upon a first transition of a clock signal;
(b) latching the input data by the latch of the first stage;
(c) transferring the latched data at an output of the latch of the first stage to the second output terminal of the circuit at an output of a latch of the second stage;
(d) selecting the first output terminal upon the clock signal first transition, and the second output terminal upon the clock signal second transition, in a first mode of operation; and
(e) selecting the second output terminal regardless of the clock transitions, in a second mode of operation.

* * * * *